United States Patent [19]

Darrow

[11] 4,044,272

[45] Aug. 23, 1977

[54] FAIL-SAFE ELECTRONIC TIME DELAY CIRCUIT

[75] Inventor: John O. G. Darrow, Murrysville, Pa.

[73] Assignee: Westinghouse Air Brake Company, Swissvale, Pa.

[21] Appl. No.: 713,995

[22] Filed: Aug. 12, 1976

[51] Int. Cl.² .................. H03K 5/13; H01H 47/18
[52] U.S. Cl. .................. 307/293; 328/129; 361/196; 361/203
[58] Field of Search .............. 307/293, 202 R, 231, 307/233 R; 328/138, 129; 317/141 S

[56] References Cited

U.S. PATENT DOCUMENTS

| | | | |
|---|---|---|---|
| 3,407,340 | 10/1968 | Hufnagel | 307/293 |
| 3,411,020 | 11/1968 | Lake | 307/293 |
| 3,747,014 | 7/1973 | Darrow | 307/202 |
| 3,873,893 | 3/1975 | Bianchini | 317/141 S |
| 3,955,125 | 5/1976 | Butler et al. | 317/141 S |

Primary Examiner—Stanley D. Miller, Jr.
Attorney, Agent, or Firm—J. B. Sotak; R. W. McIntire, Jr.

[57] ABSTRACT

This disclosure relates to a fail-safe time delay circuit for providing a definite time interval. The time delay circuit includes a resistance-capacitance charging network which is connected to a source of a d.c. supply source by a switching device. The potential charge developed on the capacitor powers an inverter to produce a.c. signals having a given frequency. The a.c. signal is fed to a multi-stage tuned amplifier having a resonant circuit tuned to the given frequency. The amplified a.c. signals are applied to a voltage doubling network which normally energizes a load and which maintains the load energized for no longer than the definite time interval after the opening of the switching device.

10 Claims, 1 Drawing Figure

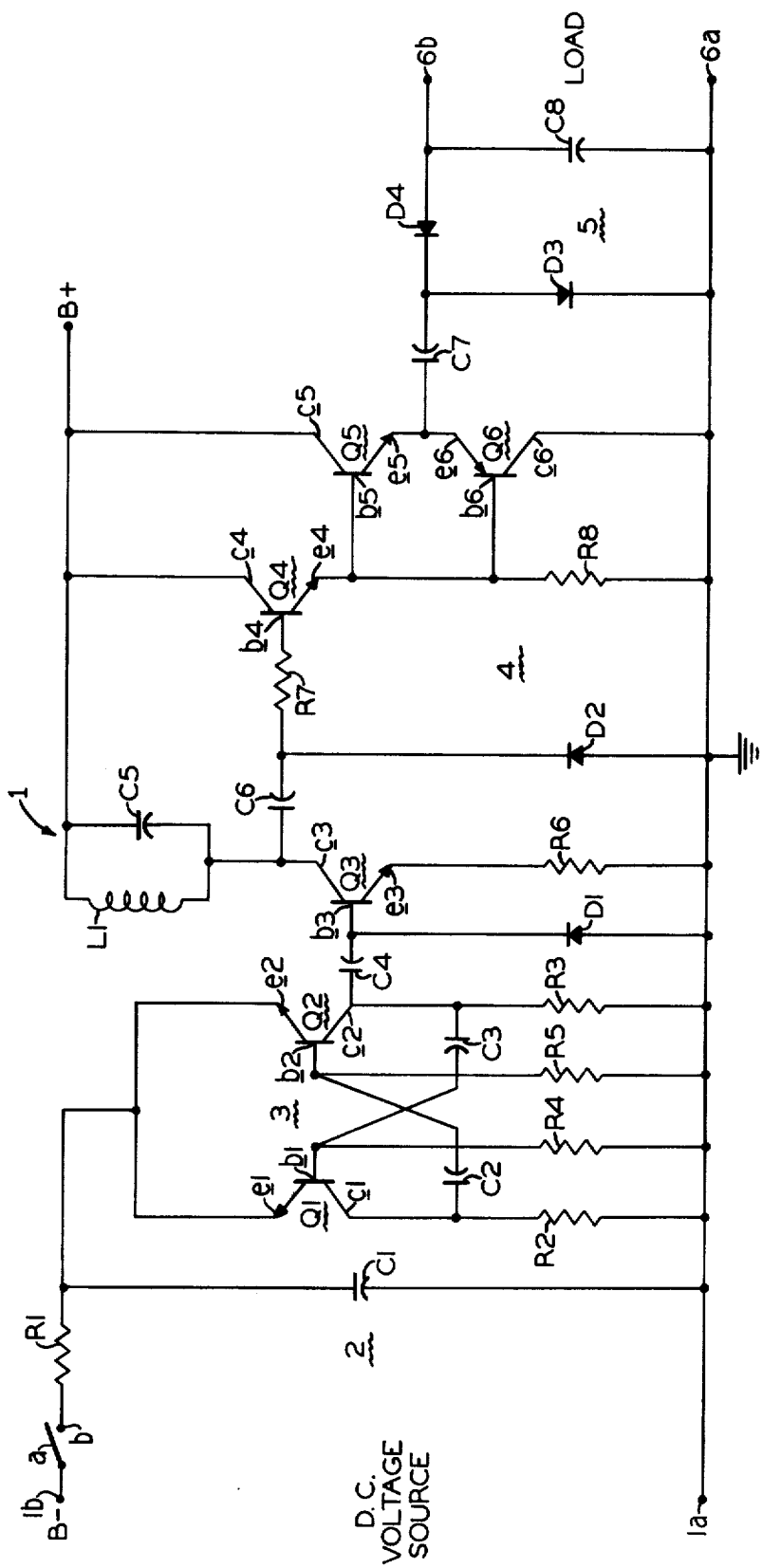

4,044,272

FAIL-SAFE ELECTRONIC TIME DELAY CIRCUIT

FIELD OF THE INVENTION

This invention relates to a fail-safe electronic timer and more particularly to a vital type of time delay circuit having an R-C network for supplying a d.c. operating potential to an inverter which feeds a tuned oscillator-amplifier to produce oscillations which are fed to a rectifier to provide a d.c. voltage for normally maintaining a load energized and for deenergizing the load a definite time interval after removal of the d.c. operating potential.

BACKGROUND OF THE INVENTION

In certain vital control systems, such as, in cab signaling apparatus for railroad and mass and/or rapid transit operations, it is extremely important to exercise the utmost care in designing and laying out circuits and networks. In order to provide the highest degree of safety to individuals as well as to afford the most protection against damage to the equipment, it is essential and mandatory to ensure that under no circumstance will a critical component or circuit failure be capable of producing an unsafe condition. Accordingly, it is readily obvious that the control apparatus must operate in a fail-safe manner so that any conceivable failure will result in a condition at least as restrictive and preferably more restrictive than that preceding the failure. For example, a component failure or circuit malfunction in a vital speed control system must not be permitted to simulate and indicate a condition for increasing or maintaining the vehicular speed. In keeping with Association of American Railroads (AAR) definition of Fail-Safeness, a vital piece of apparatus or equipment is considered to operate in a fail-safe manner when any critical component or circuit failure results in a safe condition.

In a cab signal speed control system, it is mandatory for the operator or trainman to take appropriate action within a given period of time after a more restrictive speed command is received onboard from the wayside. Thus, upon reception of a more restrictive or lower speed signal, the operator must immediately acknowledge the warning signal by decelerating the moving train to the newly received prescribed speed or the emergency brakes will be automatically set after an elapsed period of time to bring the train to a complete stop. It will be appreciated that the acknowledgment of the warning signal and the deceleration of the moving train or transit vehicle should take place as soon as possible after the reception of the more restrictive signal in order to prevent the train or vehicle from going too fast and too far beyond a safe braking and stopping point. Since the distance of travel is the product of the speed of a train and the elapsed time, it is essential that the time period from the reception of the more restrictive speed command signal to the acknowledgment by the operator must not be capable of being increased. The safety of individuals and equipment may be put in jeopardy if the elapsed time period is inadvertently or accidentally increased by a component or circuit failure. Thus, in an electronic system the time period for response is established by a time delay circuit which is actuated upon the reception of a more restrictive speed command signal. As mentioned, the length of the time period must not be extended under any circumstance. Ergo, the electronic time delay circuit must operate in a fail-safe manner in that no critical component or circuit failure is capable of extending the expiration of the time period to produce an unsafe condition.

OBJECTS OF THE INVENTION

Accordingly, it is an object of this invention to provide a new and improved time delay circuit.

Another object of this invention is to provide a fail-safe electronic timer having a definite time interval which cannot be extended by a component or circuit failure.

A further object of this invention is to provide a vital type of solid-state time delay circuit for producing a time period which is not adversely affected by failure.

Yet another object of this invention is to provide a fail-safe semiconductive timer having a time delay period which will not increase during a critical component or circuit failure.

Yet a further object of this invention is to provide a vital type of semiconductive time delay circuit having a definite desired interval of time which is incapable of being increased by a critical component or circuit malfunction.

Still another object of this invention is to provide a unique transistorized timing circuit which operates in a fail-safe manner.

Still a further object of this invention is to provide a fail-safe time delay circuit having a source of d.c. voltage, and a resistance-capacitance network coupled to the d.c. voltage, and a resistance-capacitance network coupled to the d.c. voltage source for charging the capacitance to the d.c. voltage, an inverter coupled to the resistance-capacitance network for converting the d.c. voltage charge to a.c. signals, a tuned amplifier coupled to the inverter for amplifying the a.c. signals, a rectifying network coupled to the tuned amplifier and a load coupled to the rectifying network for normally being energized and for being deenergized a definite time interval after the d.c. voltage is disconnected from the circuit.

An additional object of this invention is to provide a fail-safe electronic timing circuit which is economical in cost, simple in design, dependable in service, durable in use and efficient and reliable in operation.

SUMMARY OF THE INVENTION

In accordance with the present invention, the fail-safe electronic timing delay circuit includes a d.c. potential source, an R-C network, an inverting network, a tuned amplifier, a rectifying network and a load. The R-C network is coupled through switch contacts to the source of d.c. potential for charging the capacitance of the R-C network to the level of the d.c. potential. The inverting network includes a two-state astable transistorized multivibrator which is powered by the potential charge developed on the capacitance of the R-C network to produce a.c. signals. The a.c. signals are applied to the input of a multi-stage transistor amplifier which includes a parallel resonant circuit tuned to the natural oscillating frequency of the multivibrator. The a.c. signals are amplified by the tuned amplifier and are applied to a d.c. voltage doubling network. The d.c. voltage of the voltage doubling network normally energizes a load. The load is deenergized a predetermined time interval after the d.c. potential source is disconnected from the R-C network by the opening of the switch contacts.

The foregoing objects and other attendant features and advantages of this invention will become more fully evident from the following detailed description when considered in connection with the accompanying drawing wherein:

DESCRIPTION OF THE DRAWING

The single FIGURE is a schematic circuit diagram illustrating a preferred embodiment of a fail-safe electronic time delay circuit of the present invention.

DETAILED DESCRIPTION OF THE INVENTION

Referring now to the single FIGURE of the drawing, there is shown a vital type of transistorized timer or time delay circuit 1 embodying the features and advantages of the present invention. It will be seen that a suitable source of d.c. voltage or potential is applied across input terminals 1a and 1b. The input terminal 1a is connected to a reference or ground potential by a common lead (not characterized). As shown, the input terminal 1b is connected to a voltage charging network or circuit 2 via switch contacts a and b. The movable contact a cooperates with stationary contact b to selectively close and open the circuit to the d.c. voltage source and the charging circuit 2. In practice, the switch contacts may be operated by the speed command decoding relay or the like which is part of the cab signal and speed control equipment carried by the train or mass and/or rapid transit vehicle. As shown, the movable contact a is connected to terminal 1b or negative voltage terminal B— of the d.c. voltage source while the fixed or stationary contact b is connected to one end of resistor R1 of the charging circuit 2. The other end of resistor R1 is connected to the upper end of charging capacitor C1 while the lower end of capacitor C1 is connected to ground. It will be appreciated that the potential charge developed across the charging capacitor C1 provides the operating voltage for inverter 3 which takes the form of an oscillator.

The oscillating circuit 3 includes a par of NPN transistors Q1, Q2 forming a free-running or astable multivibrator. As shown, the transistor Q1 includes an emitter electrode e1, a base electrode b1 and a collector electrode c1 while the transistor Q2 includes an emitter electrode e2, a base electrode b2 and a collector electrode c2. It will be seen that the emitter electrodes of transistors Q1 and Q2 are directly connected together and in turn are connected to the upper end of capacitor C1. The collector electrode c1 is connected to ground via load resistor R2 while the collector electrode c2 is connected to ground via load resistor R3. The collector electrode c1 is also connected to base electrode b2 coupling capacitor C2 while the collector electrode c2 is also connected to the base electrode b1 via coupling capacitor C3. The base electrode b 1 is coupled to ground via resistor R4 while the base electrode b2 is coupled to ground via resistor R5. Thus, the d.c. voltage appearing across charging capacitor C1 is inverter to an a.c. voltage by the multivibrator 3. The frequency of the a.c. signals is relatively constant, and the peak-to-peak amplitude of the a.c. signals is substantially equal to d.c. voltage appearing across capacitor C1. Generally in multivibrators, the base resistor is comparatively larger in relation to the collector resistors, and thus the frequency of oscillation is determined by the base resistors. However, in the present case, the base resistors are chosen to be only slightly larger than the collector resistors so that the frequency of oscillation is determined by both the base and collector resistors. The substantially equal resistances also cause a rounding off of the square waves, and as will be described hereinafter, all of the resistors R2, R3, R4 and R5 pass the discharge current of capacitor and thus determine the discharge rate. The a.c. oscillations that are produced by the multivibrator 3 are delivered to the input of a multi-stage tuned amplifier 4.

As shown, the a.c. output signals derived from the collector electrode c2 are applied to the base electrode b3 of the first stage NPN transistor Q3 via coupling capacitor C4. The base electrode b3 is also connected to the cathode of clamping diode D1 which has its anode connected to ground. The input amplifying transistor Q3 is connected in a common emitter configuration. The emitter electrode e3 of transistor Q3 is coupled to ground via resistor R6. The amplifier is tuned to the natural frequency of the a.c. oscillations of multivibrator 3 by a parallel resonant circuit including inductor L1 and capacitor C5. As shown, one end of the parallel tuned circuit is directly connected to the collector c3 while the other end is connected to the positive supply terminated B+ of a suitable d.c. operating voltage (not shown). The output of the first stage is taken from collector electrode c3 and is coupled to the second amplifying stage. The second stage includes an NPN transistor Q4 having a base electrode b4, emitter electrode e4 and a collector electrode c4. The transistor Q4 is connected in a common collector configuration and the current amplifier a.c. signals are fed from collector electrode c3 to base electrode via series connected coupling capacitor C6 and parasitic suppressor resistor R7. A clamping diode D2 has its cathode connected to the junction point between capacitor C6 and resistor R7 and has its anode connected to ground. As shown, the collector electrode c4 is directly connected to terminal B+ while emitter electrode e4 is connected to ground via resistor R8. The current amplified output is derived from the emitter electrode e4 and is applied to the input of the third stage of the tuned amplifier 4. The third or output stage of amplifier 4 includes NPN and PNP transistors Q5, Q6 each connected in unity gain emitter follower configuration. The NPN transistor Q5 includes a base electrode b5, an emitter electrode e5 and a collector electrode c5 while the PNP transistor Q6 includes a base electrode b6, an emitter electrode e6 and a collector electrode c6. As shown, the base electrodes b5 and b6 are directly connected to the emitter electrode e4 of transistor Q4. The collector electrode c5 is directly connected to the positive voltage terminal B+ while the collector electrode c6 is directly connected to ground. The emitter electrodes e5 and e6 are connected in common and form the output terminal of amplifier 4 which in turn in connected to the input of voltage doubling network 5. The voltage doubler 5 includes a series charging capacitor C7 having one end connected to the emitter electrodes e5 and e6 and having the other end connected to the junction point of diodes D3 and D4. The cathode of diode D3 is directly connected to ground while its anode is connected to the cathode of diode D4. The anode of diode D4 is connected to one end of doubler charging capacitor C8 while the other end of capacitor C8 is connected to ground. It will be noted that the doubler 5 rectifies the a.c. signals obtained from the amplifier 4 into a suitable negative voltage or output potential on terminal 6b. The negative terminal 6b and common terminal 6a are connected to a suitable load, such as, a vital relay, or a fail-safe level detector when a nonvital relay is preferably used. It will be noted that the polarity of the supply voltage or operating potential of amplifier 4 is opposite to that on output terminal 6b so that a sneak path from B+ to terminal 6b will not energize the load.

Turning now to the operation, it will be assumed that the circuit is intact and functioning properly and that the train or vehicle is proceeding along its route of travel at the speed in keeping with the last received speed command signal. Under this condition, the switch contacts a, b are closed by the decoding unit and relay so that a completed circuit exists from the d.c. voltage source connected to terminals 1a and 1b to the charging circuit 2. With the switch contacts closed, the capacitor C1 is charged to a value substantially equal to that of the d.c. voltage source. Thus, the upper plate of capacitor C1 assumes a negative charge equal to B− voltage appearing on terminal 1b. Accordingly, the negative voltage charge appearing across capacitor C1 powers the multivibrator 3 into oscillation. That is, the transistors Q1 and Q2 are alternatively rendered conductive and nonconductive to produce a.c. signals or oscillations on the output or collector electrode c2. It will be appreciated that the natural frequency of oscillation is determined by the circuit parameters, namely, by the resistance-capacitance values of the base and collector resistors and coupling capacitors. It is obvious that any change in the values of these circuit parameters result in a variation of the freqency of the a.c. oscillations which is used to check the operation of the multivibrator 3. The a.c. signals developed on collector electrode c2 are applied to base electrode b3 of the first stage of the tuned amplifier 4 which is turned by the parallel resonant circuit including capacitor 5 and inductor L1 to the natural or normal frequency of oscillation of the multivibrator 3. Thus, the tuned amplifier constantly checks or monitors the multivibrator and if the frequency changes due to a variation in the circuit parameters or due to a circuit or component failure the output at collector electrode c3 will be dramatically decreased or will be entirely eliminated thereby signifying that multivibrator is not operating properly or has a malfunction.

If the multivibrator is functioning properly and is producing the appropriate frequency, the a.c. signals are amplified by the first and second stage transistors Q3 and Q4 and are applied to the input of the third stage. The amplified signals developed on collector electrode c4 are applied to the base electrodes of both of the transistors Q5 and Q6 to cause them to alternatively conduct on the respective half cycles. For example, on positive alternations, the NPN transistor Q5 is forwardly biased and rendered conductive while the complementary PNP transistor Q6 has its base reverse biased and is nonconductive. The conduction of transistor Q5 causes the capacitor C7 to be charged through a circuit extending from the terminal B+ through collector-emitter electrodes c5−e5, through capacitor C7 and through diode D3 to ground. Conversely, during negative alternations, the PNP transistor becomes conductive and establishes a discharge circuit path which extends from the left or positive plate or capacitor C7 through emitter-collector electrodes e6−c6, through capacitor C8 and through diode D4 to the right or negative plate of capacitor C7. Thus, a negative potential having twice the peak voltage of the a.c. signals is available at the output terminal 6b to energize a load, such as, a polarized type of vital relay or a fail-safe level detector. It will be appreciated that a polarized relay will only pick up at times when the voltage on terminal 6b is of a proper polarity, namely negative, and at any other time the relay remains deenergized and released. Similarly, a fail-safe level detector will only respond to a negative polarity having a preselected amplitude, namely, two times a given peak value of the amplified a.c. signals developed on the emitter electrodes e5 and e6. That is, since the d.c. voltage developed on terminals 6b, 6a is dependent on the amount of charge on capacitor C1, it will be appreciated that the preselected amplitude is chosen to correspond to the time that the capacitor C1 is allowed to discharge. Hence, the load will be energized when and only when a negative voltage has a predetermined value and is developed across output terminals 6a and 6b.

Let us now assume that as the train or vehicle is proceeding along its route of travel, a more restrictive speed command signal is received onboard to reduce speed. Under this condition, the decoding unit and appropriate relay effectively actuate an alarm for warning the trainman or operator that he has a limited time to take appropriate action to reduce the speed or emergency braking action will be instituted. At the same time that the alarm is actuated, the switch contacts a and b are opened to disconnect the d.c. voltage from charging circuit 2. The removal of the d.c. charging voltage results in the discharging of capacitor C1. The rate of discharge is dependent upon the time constant which is a function of the resistance and capacitance values. After a predetermined period of time or definite time interval the voltage across capacitor C1 will tend to decay to a value which will no longer power the output load device, since multivibrator output and hence amplifier output is proportional to C1 voltage. If the operator acknowledges by initiating appropriate action to decelerate before the expiration of the fixed time period, then the decoding unit and relay will cause the switch contacts a and b to again close so that the d.c. voltage source is reapplied to the charging circuit to maintain a potential charge across capacitor C1. Thus, the time delay circuit 1 will continue to operate to provide a negative voltage across output terminals 6b and 6a to maintain the load energized. However, if the predetermined time interval elapses, the multivibrator 3 output will become low enough so that no a.c. signals are applied to the tuned amplifier 4, and, in turn, the input to the voltage doubler 5 and the negative voltage across output terminals 6b and 6a will become low enough to cause the deenergization of the load. When the load becomes deenergized, i.e. the vital relay releases, the moving train or vehicle is placed into automatic braking, emergency or full service braking, to bring the train or vehicle to a complete stop.

As previously mentioned, it is essential that under no circumstance should the predetermined time interval be capable of being lengthened or increased due to a malfunction. Thus, the present time delay circuit must operate in a fail-safe manner to ensure that a critical component or circuit failure will not result in an unsafe condition. As previously mentioned, any variation in the circuit parameters of multivibrator 3 results in a change of the frequency of the oscillating signals. The frequency shift causes a loss of output across L1-C5 of tuned amplifier 4. Further, the opening or shorting of the transistors capacitors or resistors in multivibrator 3 destroys the a.c. amplifying characteristics or the d.c. biasing characteristics so that a.c. output signals are dramatically reduced or completely eliminated. Thus, the discharge rate of capacitor C1 is safety checked.

Further, no failure can result in a higher proportion of output signal to voltage developed across capacitor C1. Any critical failure occurring in amplifier A either results in the destruction of the a.c. amplifying characteristics or causes the loss of the necessary d.c. biasing requirements. The voltage doubling network 5 is inherently fail-safe. Thus, it is apparent that the presently described electronic timer operates in a fail-safe manner in that no critical component or circuit failure is capable of extending or increasing the originally established period of time or time interval of the circuit.

It will be appreciated that various alternations may be made by persons skilled in the art without departing from the spirit and scope of this invention. For example, the opposite type of transistors may be employed simply by reversing the polarity of the d.c. supply voltages and the diodes. The number of the amplifying stages and the gain of the amplifier 4 may be increased or decreased dependent upon the d.c. supply voltage and the demands of the load. Further, it will be appreciated that the multivibrator 3 and its design characteristics are but one way of meeting the safety requirements, and that any d.c. to a.c. inverter which has its output safely related to its input, i.e., which changes its frequency of oscillation when a failure tends to decrease its current consumption can be used in practicing this invention. Moreover, it is apparent that other modifications and changes may be made to the presently described invention and therefore it is understood that all variations, modifications, and equivalents falling within the spirit and scope of the present invention are herein meant to be included in the appended claims.

Having now described the invention, what I claim as new and desire to secure by Letters Patent, is:

1. A fail-safe time delay circuit comprising,
   a. a source of d.c. voltage,
   b. a resistance-capacitance network coupled to said d.c. voltage source for charging said capacitance to said d.c. voltage,
   c. an inverter coupled to said resistance-capacitance network for converting said d.c. voltage charge to a.c. signals,
   d. a tuned amplifier coupled to said inverter for amplifying said a.c. signals,
   e. a rectifier coupled to said tuned amplifier, and f. a load coupled to said rectifier for normally being energized and for being deenergized a definite time interval after the source of d.c. voltage is disconnected from the circuit.

2. A fail-safe time circuit, as defined in claim 1, wherein said inverter is a free-running solid-state multivibrator.

3. A fail-safe time delay circuit, as defined in claim 1, wherein said inverter is an oscillating circuit.

4. A fail-safe time delay circuit, as defined in claim 1, wherein said tuned amplifier includes a parallel tank circuit connected to the output circuit of a common emitter stage.

5. A fail-safe time delay circuit, as defined in claim 1, wherein said tuned amplifier includes a plurality of transistor stages.

6. A fail-safe time delay circuit, as defined in claim 1, wherein said rectifier includes a voltage doubling network is coupled to the output of said tuned amplifier.

7. A fail-safe time delay circuit, as defined in claim 1, wherein said voltage doubling network is coupled to a pair of complementary transistors connected in an emitter follower configuration.

8. A fail-safe time delay circuit, as defined in claim 1, wherein said inverter includes a pair of transistors coupled as a bistable multivibrator.

9. A fail-safe time delay circuit, as defined in claim 1, wherein a switch contact is coupled to said source of d.c. voltage for disconnecting said d.c. voltage source.

10. A fail-safe time delay circuit, as defined in claim 6, wherein said voltage doubling network includes a pair of diodes and a pair of capacitors.

* * * * *